(12) United States Patent
Kwon

(10) Patent No.: US 6,846,088 B2
(45) Date of Patent: Jan. 25, 2005

(54) SHOCK PROTECTORS FOR MICRO-MECHANICAL SYSTEMS

(75) Inventor: Haesung Kwon, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/726,098

(22) Filed: Dec. 1, 2003

(65) Prior Publication Data

US 2004/0120058 A1 Jun. 24, 2004

Related U.S. Application Data

(62) Division of application No. 10/260,257, filed on Sep. 27, 2002, now Pat. No. 6,733,144.

(51) Int. Cl.[7] .............................................. G02B 7/182
(52) U.S. Cl. ....................... 359/876; 359/877; 359/221; 359/222
(58) Field of Search ................................. 359/876, 877, 359/221–224, 846, 290–295; 310/36, 40

(56) References Cited

U.S. PATENT DOCUMENTS

| | | |
|---|---|---|
| 4,360,182 A | 11/1982 | Titus |
| 4,390,151 A | 6/1983 | Schneider |
| 4,907,869 A | 3/1990 | Schwarz et al. |
| 5,535,047 A | 7/1996 | Hornbeck |
| 5,583,688 A | 12/1996 | Hornbeck |
| 5,648,618 A | 7/1997 | Neukermans et al. |
| 5,867,302 A | 2/1999 | Fleming |
| 5,960,132 A | 9/1999 | Lin |
| 6,028,689 A | 2/2000 | Michalicek et al. |
| 6,040,935 A | 3/2000 | Michalicek |
| 6,044,705 A | 4/2000 | Neukermans et al. |
| 6,198,180 B1 | 3/2001 | Garcia |
| 6,256,134 B1 | 7/2001 | Dhular et al. |
| 6,283,601 B1 | 9/2001 | Hagelin et al. |
| 6,366,414 B1 | 4/2002 | Aksyuk et al. |
| 6,466,356 B1 | 10/2002 | Peeters et al. |
| 2001/0030817 A1 | 10/2001 | Hagelin et al. |
| 2001/0048265 A1 | 12/2001 | Miller et al. |
| 2002/0131679 A1 | 9/2002 | Nasiri |
| 2002/0131682 A1 | 9/2002 | Nasiri et al. |

FOREIGN PATENT DOCUMENTS

| | | |
|---|---|---|
| WO | WO 01/88594 | 11/2001 |
| WO | WO 01/96930 | 12/2001 |

OTHER PUBLICATIONS

U.S. Appl. No. 09/779,189, filed Feb. 7, 2001, Nasiri.
U.S. Appl. No. 09/894,021, filed Jun. 27, 2001, Nasiti et al.
U.S. Appl. No. 10/225,081, filed Aug. 20, 2002, Starr et al.
Toshiyoshi, et al., "Electrostatic Micro Torsion Mirrors for an Optical Switch Matrix," Journal of Microelectromechanical Systems, vol. 5, No. 4, (Dec. 1996), pp. 231–237.
De Gaspari, J., "MEMS' Rocky Road," Mechanical Engineering, (Jun. 2002), pp. 1–9.

*Primary Examiner*—Mohammad Sikder
(74) *Attorney, Agent, or Firm*—Blakely, Sokoloff, Taylor & Zafman LLP

(57) ABSTRACT

The present invention is directed towards shock protectors for a pedestal suspended over a lower surface by a plurality of gimbal springs. Each gimbal spring is connected to a linkage arm that attaches to an actuator. A stop located below the bottom of the pedestal prevents the gimbal springs and/or other structures from impacting the lower surface. In addition, the stop prevents excessively high strain in the gimbal springs. A shock absorber extending from at least one linkage arm serves a similar purpose when the pedestal is tilted, rather than simply displaced.

4 Claims, 7 Drawing Sheets

SHOCK PROTECTORS FOR MICRO-MECHANICAL SYSTEMS

CROSS-REFERENCE TO RELATED APPLICATIONS

This application is a divisional of, and claims priority under 35 U.S.C. §120 from, U.S. patent application Ser. No. 10/260,257, filed Sept. 27, 2002, now U.S. Pat. No. 6,733,144.

FIELD OF THE INVENTION

The present invention is directed towards shock protectors for micro-mechanical systems.

BACKGROUND OF THE INVENTION

Fiber optic networks have the potential for greatly increasing telecommunication bandwidths and data rates. The demand for increased capacity continues to grow, especially as more and more information is transmitted across the Internet.

One limitation of fiber optic networks as currently implemented is their inability to directly switch optically encoded packets of data from a fiber on a source network or network node to a fiber on a destination network or network node. Instead, optically encoded data are dropped from the source network fiber, converted to electrically encoded data, switched to the destination network using conventional electronic switches, converted back into optically encoded data, and injected into the destination network fiber.

Micromachined mirror arrays offer the ability to directly switch optically encoded data in devices, known as all-optical cross connect switches, from a source fiber on a source network to a destination fiber on a destination network without having to convert the data from optical to electronic and back again. For such mirror arrays to be commercially useful, they must be able to cross connect approximately 1000 input fibers with an equal number of output fibers in a compact volume. This can be achieved with mirrors that can be densely packed together and that are rotatable by relatively large angles in an arbitrary angular direction.

Recent developments in the field of microelectromechanical systems (MEMS) allow for the bulk production of microelectromechanical mirrors and mirror arrays that can be used in all-optical cross connect switches. MEMS-based mirrors and mirror arrays can be inexpensively designed and produced using conventional tools developed for the design and production of integrated circuits. Such tools include computer-aided design, photolithography, bulk and surface micro-machining, wet and dry isotropic and anisotropic etching, and batch processing. In addition, deep reactive ion etching methods (DRIE) allow silicon devices to be produced having high aspect ratios (~20:1) that rival those that can be achieved using the prohibitively expensive lithography, electroplating and molding process which requires access to a synchrotron radiation source.

A number of microelectromechanical mirror arrays have already been designed for use with MEMS production processes and techniques. In U.S. patent application Ser. No. 09/779,189 of Nasiri, filed on Feb. 7, 2001, and hereby incorporated by reference in its entirety, a mirror is mounted on a support post mounted on a freely moving plate. In Nasiri, two orthogonally oriented pairs of rotatable actuators are coupled to the freely moving plate by gimbal springs. By properly coordinating each pair of actuators, the mirror can be rotated without displacement under ideal conditions.

Although the Nasiri application shows improved ability to manipulate the mirror rotation without displacement, the performance of similar configurations can be greatly improved by paying special attention to the system used for transmitting rotation from the actuators to the freely moving plate. U.S. patent application Ser. No. 10/225,081 of Starr et al, filed on Aug. 20, 2002 and hereby incorporated by reference in its entirety, discloses special gimbal springs and lever arms for coupling the actuators to a gimbaled platform, which is herein denoted a pedestal.

What has been missing from previous mirror rotation systems are means to reduce the detrimental effects of shock loads to the system. Such loads can lead to large out-of-plane displacements of the pedestal that overly strain the gimbal springs (and in some embodiments also actuator springs) and/or lead to unnecessary vibrations in the system.

SUMMARY OF THE INVENTION

The present invention discloses structures that can reduce the out-of-plane displacements of a pedestal that is suspended by gimbal springs attached to linkage arms. One embodiment of the invention includes a stop that is located below the pedestal, between the pedestal and a lower surface. The stop prevents the pedestal from impacting the lower surface. In most embodiments, the stop also reduces the maximum strains experienced by the gimbal springs, and in many circumstances, the actuator springs.

Another embodiment of the present invention includes a shock absorber that extends from at least one linkage arm beyond where the linkage arm attaches to the gimbal spring. In case of excessive rotation of an actuator connected to the linkage arm, or exposure to a sudden acceleration, the shock absorber impacts the lower surface and resists further rotation of the actuator.

These shock protectors can be used either independently or in combination with each other or with other mechanisms to limit the out-of-plane displacement of the pedestal.

Some embodiments of the present invention also provide a method for increasing heat transfer from a mirror coupled to a pedestal suspended by gimbal springs over a lower surface. The method includes the provision of a solid heat-conduction path to the lower surface, wherein the heat-conduction path is located within 3 $\mu$m of the pedestal. By locating a solid heat conduction path so close to the pedestal, the thermal resistance associated with the gap is decreased, thereby enhancing the heat transfer. In various embodiments the inclusion of a stop located so closely below the pedestal serves as the desired solid heat-conduction path.

Additional features and advantages of the invention will be set forth in part in the description that follows, and in part will be obvious from the description, or may be learned by practice of the invention. Various embodiments of the invention do not necessarily include all of the stated features or achieve all of the stated advantages.

BRIEF DESCRIPTION OF THE DRAWINGS

The accompanying drawings illustrate a complete embodiment of the invention according to the best modes so far devised for the practical application of the principles thereof, and in which:

FIG. 4a shows the pedestal displacement being limited by the stop. FIG. 4b shows excessive gimbal spring strain without the stop.

Alternatively, FIG. 4c shows the same gimbal spring strain as in FIG. 4a, but the actuators are significantly rotated without the stop. In practice, both excessive gimbal spring strain and some actuator rotation is likely without the stop.

DETAILED DESCRIPTION OF PREFERRED EMBODIMENTS

Figure 1:
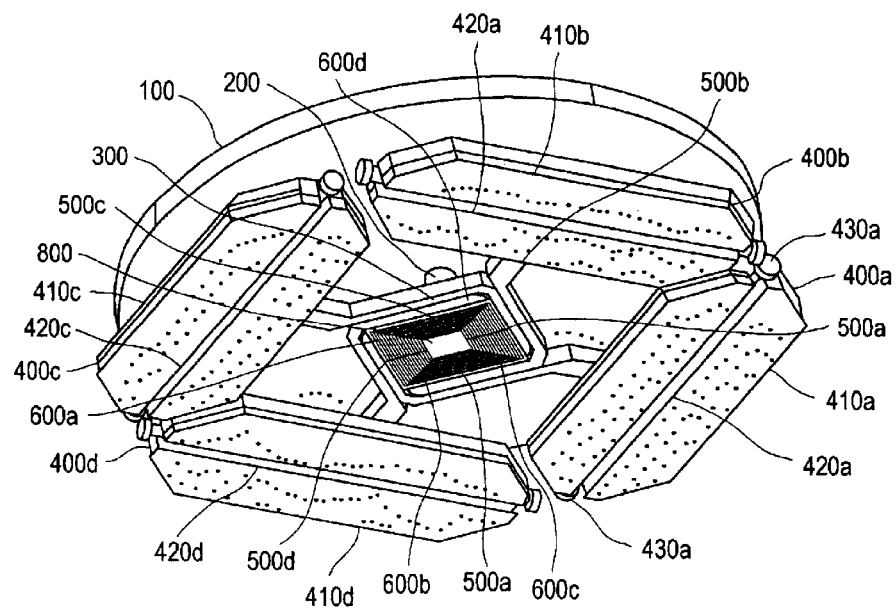
FIG. 1 shows a perspective view from below of a micro-mechanical mirror system.

Referring now to the drawings, where similar elements are numbered the same, FIG. 1 shows a perspective view from below of a micro-mechanical mirror system. A mirror 100 is mounted on a post 200, which is mounted on a pedestal 300. The mirror 100 has its reflective surface opposite to the side shown. The pedestal 300 is largely obscured by a stop 800 that will be discussed in more detail later.

Although dimensions and shapes differ with various embodiments, in a preferred embodiment a mirror 100 has the shape of an elliptical disk. In preferred embodiments, the mirror has a thickness between about 25 $\mu$m and 35 $\mu$m, most preferably about 30 $\mu$m. Most preferably, the mirror has a major axis of about 1100 $\mu$m and a minor axis of about 1000 $\mu$m. The slightly elliptical cross section reduces possible resonances between the orthogonal rotation directions of the mirror. Mirrors with circular, rectangular, hexagonal, octagonal, or most any other planform can be used on alternative embodiments. Similarly, although in preferred embodiments, the post 200 has the shape of circular cylinder, the shape and dimensions of the post can vary greatly in various embodiments. Howsoever, in the preferred embodiments, the post has a diameter between about 50 $\mu$m and 70 $\mu$m and an axial length of between 75 $\mu$m and 95 $\mu$m. Most preferably, the post has a diameter of about 60 $\mu$m and an axial length of about 85 $\mu$m.

Figure 2:
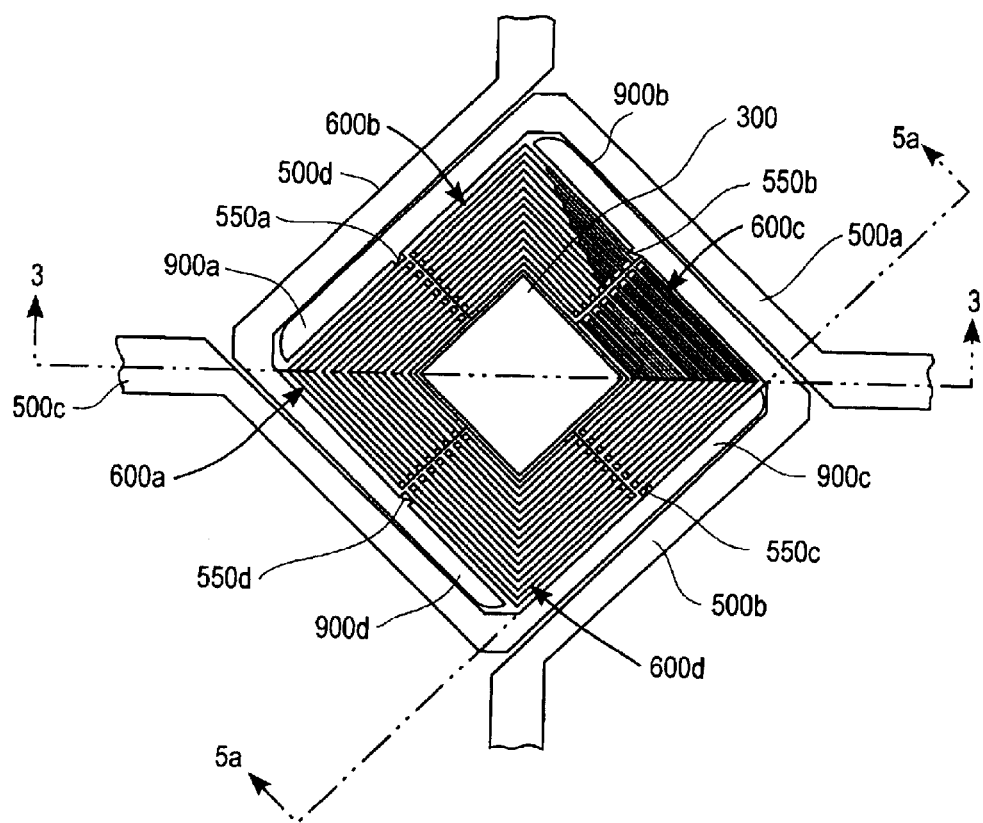
FIG. 2 is a plan view from above of the central portion of the micro-mechanical mirror system. The mirror, post, and stop have been removed for clarity and the actuators are not in the field of view.

FIG. 2 shows a plan view of the pedestal 300 and the immediately surrounding structures. The plan view is from the mirror side of the pedestal 300. The mirror 100, the post 200, and the stop 800 have been removed from FIG. 2 for clarity. The shape of the pedestal 300 varies according to the particular embodiment. In this embodiment, in plan view, the pedestal 300 is diamond shaped and has a thickness (out of the paper) of approximately 30 $\mu$m. In other embodiments the planform of the pedestal may be circular, square, octagonal, or any other suitable shape and size. In the most preferred embodiments, the smallest distance measured through the center of the pedestal planform is between 50 $\mu$m and 70 $\mu$m. Although the most preferred thickness of the pedestal is between 25 $\mu$m and 35 $\mu$m, the thickness may vary, according to the specific details of the embodiment.

As seen in both FIG. 1 and FIG. 2, the pedestal 300 is suspended by a plurality of gimbal springs 600. In this particular embodiment, four gimbal springs 600a, 600b, 600c, and 600d are each connected to a respective linkage arm 500a, 500b, 500c, and 500d. In the illustrated embodiment, the gimbal springs 600 are comprised of spring leg pairs coupled in series. Each spring leg pair is comprised of two orthogonally oriented legs. The particular type of gimbal springs 600 used may vary according to the specific embodiment of the invention. Examples of some other acceptable gimbal springs are disclosed in the patent applications of Nasiri (U.S. patent application Ser. No. 09/779, 189) and Starr et al (U.S. patent application Ser. No. 10/225,081) both of which have been incorporated by reference in their entireties. Other types of gimbal springs known to those skilled in the art may also be employed in alternative embodiments.

Each linkage arm 500 is coupled to its respective actuator 400 (shown in FIG. 1, but not in FIG. 2). Hence, actuator 400a is coupled to linkage arm 500a, which is connected to gimbal spring 600a, at a linkage-arm/gimbal-spring attachment point 550a. The gimbal spring 600a connects to the pedestal 300. The other actuators 400b, 400c, 400d, linkage arms 500b, 500c, 500d, and gimbal springs 600b, 600c, 600d are similarly configured. The embodiment shown employs wraparound linkage arms. Wraparound linkage arms are configured so that the connection to the pedestal 300 is made on the side of the pedestal 300 opposite to that of the corresponding actuator 400. Alternative embodiments do not require wraparound linkage arms, but instead may use linkage arms 400 that are configured such that the connection to the pedestal 300 is made on the same side of the pedestal 300 as the respective actuator 400. As will be discussed in more detail later, a shock absorber 900 extends from each linkage arm 500, beyond the linkage-arm/gimbal-spring attachment point 550.

With reference to FIG. 1, in the particular embodiment illustrated, electrostatic actuators are shown and each actuator 400 is disposed near two electrodes 410 and 420. As with the other components the electrodes associated with actuator 400a have the letter a appended to their reference designation, so energizing electrodes 410a and/or 420a actuates actuator 400a. Although electrostatic actuators are used for illustration purposes here, the actuation means is not critical to the invention. For example, piezoelectric, electromagnetic, thermal, and fluidic actuation are some of the possible other actuation means used in alternative embodiments.

In the particular embodiment shown in FIGS. 1 and 2, four actuators are shown. However, in alternative embodiments of the invention different numbers of actuators may be used.

Figure 3:
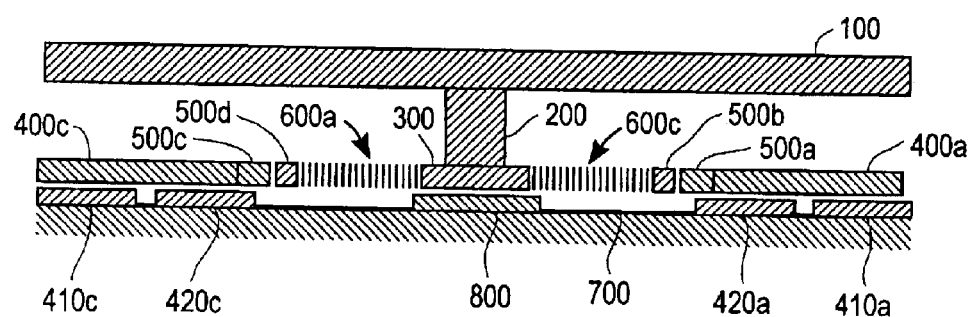
FIG. 3 is a section cut through the corners of pedestal, cutting through actuator 400a on the right and actuator 400c on the left. The section cut corresponds approximately to the section line 3—3 in FIG. 2 (but extending beyond the field of view of FIG. 2 so as to include the actuators). The section cut only shows structures that intersect the section, not those behind the section.

To simplify the explanation of the invention, FIG. 3 shows a section cut through the corners of pedestal 300, cutting through actuator 400a on the right and actuator 400c on the left. The section line 3—3 of FIG. 2 approximately indicates the section cut. The actuators, although outside of the field of view in FIG. 2, are included in FIG. 3. Only structures that intersect the section, not those behind the section are shown in FIG. 3. A structure not shown in FIGS. 1 and 2 is a lower surface 700. Its inclusion in FIGS. 1 and 2 would have obscured other important details. An actuator plane is defined as a plane parallel to the lower surface 700 and containing the axis of rotation of an actuator 400. In preferred embodiments, as shown in the figures, all of the actuators 400a–400d are approximately in the same actuator plane, although this is not required in alternative embodiments (i.e., each actuator may be in its own actuator plane). In preferred embodiments the actuators 400 are suspended in the actuator plane through the use of actuator springs or hinges. (For clarity, only the actuator springs 430a of the actuator 400a are labeled in FIG. 1. The corresponding structures on actuators 400b, 400c, and 400d are illustrated but not labeled). Any appropriate means of suspension may be used.

The pedestal 300 has a top and a bottom. For convention, the top of the pedestal 300 will be considered as that portion of the pedestal 300 to which the post 200 is mounted. As previously shown, the mirror 100 is mounted to the post 200.

Consider next structures in the actuator plane. On the right, actuator 400a is shown connected to linkage arm 500a. Only a small portion of linkage arm 500a is shown because most of the arm extends behind the section plane and therefore is not in the section illustrated. A small portion of linkage arm 500b is shown near linkage arm 500a. This portion of linkage arm 500b has extended from in front of the section plane and extends behind the section plane. Gimbal spring 600c is shown near linkage arm 500b. The gimbal spring 600c connects to linkage arm 500c (not shown) in front of the section plane and connects to the pedestal 300 at a location behind the section plane. Corresponding relationships exist on the left of the figure. The gimbal springs 600 suspend the pedestal 300 over the lower surface 700.

The outer 410a and 410c electrodes and the inner 420a and 420c electrodes are shown for this embodiment in which electrostatic actuators are employed. If other actuation means were used, the electrodes 410 and 420 would be eliminated or replaced with some other structures appropriate to the desired actuation means. In preferred embodiments in which electrostatic actuation is used, the height of the electrodes 410 and 420 depends upon the details of the particular embodiment. However, in the most preferred embodiments, the electrodes 410 and 420 typically extend about 11–12 µm above the lower surface 700.

A stop 800 is located below the bottom of the pedestal 300. In preferred embodiments, the stop 800 extends approximately 10 µm upwards from the lower surface 700. In preferred embodiments the stop 800 extends to within approximately 2 µm to 3 µm of the bottom of the pedestal 300. In such embodiments, the top of the stop 800 is sufficiently close to the bottom of the pedestal 300 that significant heat transfer can occur between the pedestal 300 and the stop 800. In essence, the stop 800 provides a solid heat-conduction path to the lower surface 700. Estimates suggest that the heat transfer from the mirror 100 can be increased by as much as 10% through the inclusion of such a solid heat-conduction path. The heat transfer is further facilitated in embodiments in which the solid heat-conduction path includes a high-conductivity material. In preferred realizations of such embodiments, the stop 800 is either coated with or fabricated from a metal, such as copper or aluminum to enhance the heat transfer. Another way to increase the heat transfer is for the cross-sectional area of the solid heat-conduction path to be at least 4 times greater than the cross-sectional area of the pedestal 300. In the case of the stop 800, this means that the top of the stop 800 has a cross-sectional area that is at least four times the cross-sectional area of the bottom of the pedestal 300. In some preferred embodiments with a stop 800 that has a top with a circular cross-section, the circular cross-section of the top has a diameter greater than 120 µm.

Figure 4A:
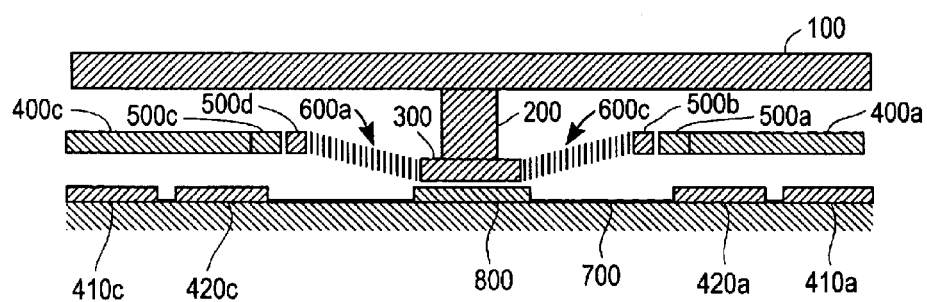
FIGS. 4a–c are similar to FIG. 3 except that the mirror, post, and pedestal assembly are displaced downward. Note that in FIGS. 4a–c the gap between the electrodes and the actuators has been exaggerated to emphasize the role of the stop.
Figure 4B:
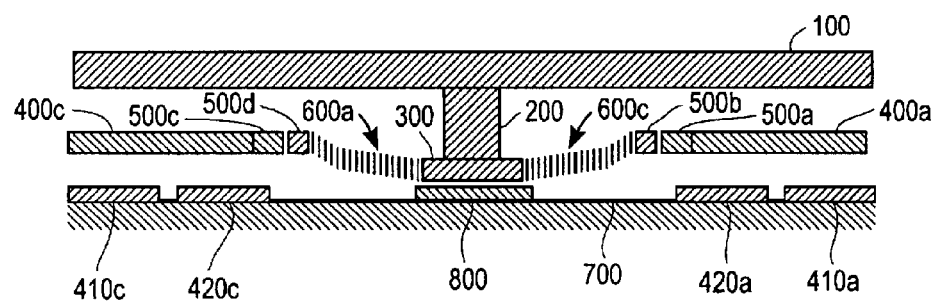
Figure 4C:
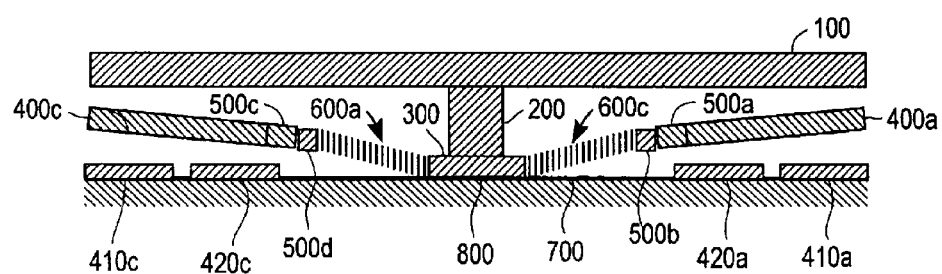

Although some preferred embodiments employing a stop 800 provide for improved heat transfer from the mirror 100 to the lower surface 700, the stop 800 need not perform this function to be useful. FIGS. 4a–4c illustrate scenarios that may occur when the pedestal 300 (and hence the post 200 and the mirror 100) are displaced from their equilibrium position. (The equilibrium position is shown in FIG. 3). The displacement could be the result of any of a number of sources, including but not limited to system vibration, an electrical power surge, or other environmental disturbances. To better illustrate the effects of such a displacement, the gap between the lower surface 700 and the pedestal 300 has been exaggerated in FIGS. 4a–4c.

FIG. 4a shows the stop 800 limiting the displacement of the pedestal 300 in the direction perpendicular to the lower surface 700. In preferred embodiments, the presence of the stop 800 limits the motion of the pedestal 300 to levels that are within the strain limits of the gimbal springs 600 and which result in little or no undesirable rotation of the actuators 400. The limited displacement also serves to help limit the impact loading on the pedestal 300 as it is brought to rest. This reduces wear and tear and also vibrations in the system.

FIG. 4b illustrates one possible scenario without a stop 800. In this scenario the actuators 400a and 400c have been maintained approximately in their equilibrium positions. This could be accomplished either by the active adjustments of the voltages to electrodes 410a, 420a, 410c, and 420c, through appropriate choices of spring constants, or through some other means. Note that in this scenario, the gimbal springs 600a and 600c experience significantly more strain than was illustrated in FIG. 4a with the stop 800.

FIG. 4c illustrates another possible scenario without a stop 800. In this scenario, the strain in the gimbal springs 600a and 600c is kept the same as that in FIG. 4a, but the actuators 400a and 400c now rotate to accommodate the additional displacement. The rotation of the actuators 400a and 400c brings a portion of the actuators 400a and 400c much closer to the electrodes 420a and 420c. This could potentially result in a dangerous snapdown mode wherein the electrostatic force between the electrodes 420a and 420c and the downward leaning portion of the actuators 4000a and 400c becomes so great that the actuators 400a and 400c snap down into contact with the electrodes 420a and 420c. In practice, the response of the system without the stop 800 would likely be some combination of the scenarios depicted in FIGS. 4b and 4c. In any case, the scenario depicted in FIG. 4a, with the stop 800 is preferable.

Figure 5A:
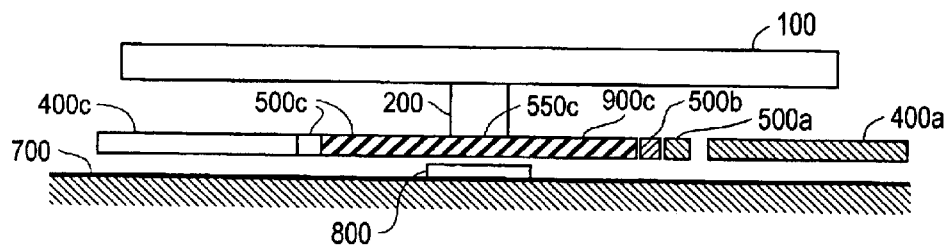
FIG. 5a is a section cut corresponding approximately to the section line 5a—5a in FIG. 2. (The section cut extends beyond the field of view of FIG. 2 so as to include the actuators.)

Referring back to FIG. 2, a shock absorber 900 is shown extending from each linkage arm 500 beyond the linkage-arm/gimbal-spring attachment point 550. FIG. 5a is a section view roughly corresponding to the section 5a—5a in FIG. 2. The actuators, although outside of the field of view in FIG. 2, are included in FIG. 5a. The mirror 100, the post 200, the actuator 400c, the stop 800, and a small portion of the linkage arm 500c are shown behind the section plane. The pedestal and the gimbal springs are obscured by the linkage arm 500c and the shock absorber 900c. The linkage-arm/gimbal-spring attachment point 550c is located in the center and substantially defines the end of the linkage arm 500c and the beginning of the shock absorber 900c. Other structures, such as the electrodes 410 and 420, and a portion of the linkage arm 500*d* are not shown as they would unduly clutter the figure.

Figure 5B:
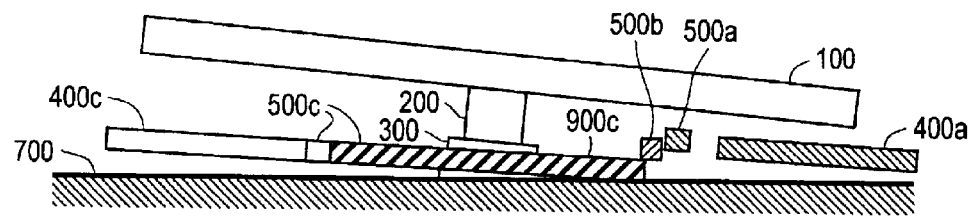
FIG. 5b is the structure of FIG. 5a with the mirror, post, and pedestal rotated. The shock absorber contacts the lower surface.

The shock absorbers 900 are designed to contact the lower surface 700 in case of excessive rotation of any of the actuators 400. FIG. 5*b* illustrates such a rotation with the same view and same illustrated structures as that of FIG. 5*a*. In this case the actuators 400*a* and 400*c* are rotated in the same sense, resulting in a tilting of the mirror 100, the post 200, and the pedestal 300. Only the shock absorber 900*c* contacted the lower surface 700. Alternatively, if actuator 400*a* had rotated counterclockwise, its shock absorber (900*a*, but not shown in FIG. 5*b*) also could have contacted the lower surface 700.

Although FIG. 2 shows a shock absorber 900 extending from all the linkage arms 500, a single shock absorber, for example shock absorber 900*a*, extending from a single linkage arm 500*a* beyond the linkage-arm/gimbal-spring attachment point 550*a* is considered within the broad scope of the invention. In the most preferred embodiments the shock absorber 900 is simply an extension of the linkage arm 500. Maintaining the width and thickness of the shock absorber 900 to be the same as the linkage arm 500 facilitates manufacture of the device. However, the invention encompasses shock absorbers 900 with widths and thicknesses that differ from those of the corresponding linkage arms 500. In fact, FIG. 2 shows the tip of each shock absorber 900 to be contoured to avoid interference-with a nearby linkage arm. Other modifications to the shock absorber 900 come within the broad scope of the invention. For instance, the shock absorber 900 may be more flexible than the corresponding linkage arm 500, either by modifying its dimensions, or by fabricating it from a different material.

The inclusion of the shock absorbers is shown in the context of wraparound linkage arms. However, minor modifications to the linkage arms allow the shock absorbers to be incorporated into designs without wraparound linkage arms. Such designs are contained within the broad scope of the invention.

In preferred embodiments, a shock absorber extends a sufficiently long distance to ensure that it contacts the lower surface prior to the corresponding gimbal spring contacting the lower surface. In the embodiment illustrated in FIG. 2, each shock absorber 900 has a length just slightly less than the length of the longest leg of the corresponding gimbal spring 600. Most preferably, the shock absorber 900 contacts the lower surface 700 when the corresponding actuator 400 rotates just slightly more than its design rotation. The length of the shock absorber 900 can therefore be matched to the design rotation angle of the actuator 400. If all other parameters. remain the same, the longer the shock absorber 900, the more restricted is the rotation.

Figure 6:
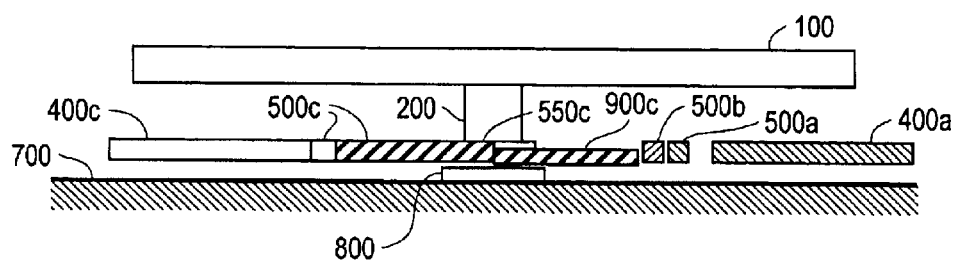
FIG. 6 illustrates a section cut similar to FIG. 5a, but of an alternative embodiment.

An alternative embodiment of a shock absorber is illustrated in FIG. 6. In this embodiment, the shock absorber 900*c* is disposed closer to the lower surface 700 than the linkage arm 500*c*. In such an embodiment the shock absorber 900*c* may be the same thickness as the linkage arm 500*c* or it may have a different thickness.

The disclosed embodiments of the invention include both a stop 800 and at least one shock absorber 900. However, alternative embodiments of the invention do not require both structures. Some other embodiments include only a stop 800, while others include only one or more shock absorbers 900.

The above-described micro-mechanical rotation systems can be fabricated with known MEMS fabrication techniques. Details of how similar systems are fabricated in the context of a mirror array are described by Nasiri, Smith, Marx, and Novack in U.S. patent application Ser. No. 09/894,021, filed Jun. 27, 2001, which is hereby incorporated by reference in it entirety.

The above description and drawings are only illustrative of preferred embodiments, and the present invention is not intended to be limited thereto. Any modification of the present invention that comes within the spirit and scope of the following claims is considered part of the present invention.

What is claimed is:

1. method for increasing heat transfer from a mirror coupled to a pedestal suspended by gimbal springs over a lower surface, the method comprising:

providing a solid heat-conduction path to the lower surface, the solid heat-conduction path being located within 3 $\mu$m of the pedestal.

2. The method, according to claim 1, wherein the solid heat-conduction path has a cross-sectional area that is at least 4 times greater than the cross-sectional area of the pedestal.

3. The method, according to claim 1, wherein the heat transfer from the mirror is increased by at least 10%.

4. The method, according to claim 1, wherein the solid heat-conduction path includes a high-conductivity material.

\* \* \* \* \*

UNITED STATES PATENT AND TRADEMARK OFFICE
CERTIFICATE OF CORRECTION

PATENT NO. : 6,846,088 B1
DATED : January 25, 2005
INVENTOR(S) : Kwon

It is certified that error appears in the above-identified patent and that said Letters Patent is hereby corrected as shown below:

<u>Column 8,</u>
Line 32, before "method", insert -- A --.

Signed and Sealed this

Tenth Day of May, 2005

JON W. DUDAS
*Director of the United States Patent and Trademark Office*